United States Patent Office 3,012,316

Patented Dec. 12, 1961

3,012,316

ATTACHING LEADS TO SILICON SEMICONDUCTOR DEVICES

Horst W. Knaü, Lehen B. Freiburg I.B., Germany, assignor to Clevite Corporation, Cleveland, Ohio, a corporation of Ohio

No Drawing. Filed Apr. 13, 1959, Ser. No. 805,659
Claims priority, application Germany Apr. 11, 1958
2 Claims. (Cl. 29—473.1)

This invention relates to methods for attaching lead wires to the wafer of silicon semiconductor devices which are alloyed with aluminum.

For the sake of example the invention will be described as applied to transistors but it will be appreciated that its field of applicability includes diodes and the like.

Silicon transistors alloyed with aluminum and having emitter and collector regions formed by alloying "pills" or "pellets" onto a wafer of the semiconductor material are well-known. The attachment of contacts, i.e., lead wires, to the emitter and collector regions of such transistors poses considerable difficulties. The customary attachment techniques such as soldering or welding are unsatisfactory because they yield joints which are either mechanically or electrically inferior.

The present invention contemplates a process which enables the attainment of stable contacts without adverse effect on the properties of the transistor. According to the invention a method of attaching contacts to silicon transistors alloyed with aluminum comprises first alloying emitter and collector pills onto a silicon wafer and then alloying platinum or platinum alloy lead wires onto the collector and emitter pills at a lower temperature.

According to a particular feature of the invention alloying on of the lead wires is carried out at a temperature of at least 630° C., preferably about 650° C., the temperature being maintained for a brief period sufficient only to effect joinder as hereinafter explained.

The object of the invention is to provide novel methods of attaching lead wires to silicon semiconductors alloyed with aluminum.

This and further objects of the invention, its advantages, scope and the manner in which it may be practiced will be apparent to those conversant with the art from the following description and subjoined claims.

The first step of the method is the alloying of collector and emitter pellets to the silicon wafer. This is performed in accordance with techniques which are, in themselves, well-known in the art. The alloying is carried out at a temperature of about 700° C. and during this step an aluminum-silicon eutectic melting at 577° C. is formed in the pills.

The lead wires are attached by placing one end of the wire in contact with the pill to which it is to be attached and heating the device briefly to a temperature considerably lower than the 700° C. used in alloying. As mentioned above a temperature of at least 630° C. is required and 650° C. preferred. The lead wires are of platinum or platinum alloy and at approximately 630° C. a platinum-aluminum alloy of good stability is formed. A rapid heating and cooling of the device is employed for attaching the leads. This is important to assure that only the outer surface regions of the lead wire fuse and alloy with the pill leaving an undissolved core at the interior of the wire. Too long a heating period results in the wire being alloyed throughout; this causes embrittlement of the wire with the result that it is easily broken off at the point of junction with the pill.

Therefore, the time and temperature conditions employed during the attaching step are adjusted to insure that the alloying is limited to the outer surface regions of the wire and the contiguous pill material and does not involve the wafer proper.

Because the temperature at which the lead attachment is carried out are well below the 700° C. temperature used in alloying, the reheating may be carried out without detrimental effect on the characteristics of the device. This is particularly true because the bonding temperature is maintained for so brief an interval. It is convenient to have the contact pressure between the lead wire and the pill during attachment provided by the weight of the wire itself. The manner in which this can be accomplished will be seen from the following description of a specific example of the process contemplated by the invention.

Conventionally, alloying of the emitter and collector pills is accomplished using an alloying fixture or "jig." The silicon wafer is placed in a boat and the emitter or collector pill is placed on top of the wafer. An arrangement of "plugs" and "pins" are disposed to weight down the wafer and pill as explained, for example, in U.S. Patent No. 2,835,615. A "pin" having a central bore is employed and after the emitter and collector pill have been alloyed, the lead wire, cut to an appropriate length, is inserted into the "pin" so that the lower end of the wire contacts the pill to which it is to be attached. In the event that the weight of the wire itself is insufficient to provide the desired contact pressure, it may be loaded with a small piece of graphite attached to its upper end. Then the transistor with the wire in place and extending upwardly is placed in an alloying oven and quickly heated in vacuo to about 650° C. and then quickly cooled. The wire penetrates into the pill which melts at 577° C. and a platinum-aluminum alloy is formed. Upon cooling, the lead wire is permanently bonded to the pill.

The transistor is then inverted and the process repeated to attach the lead to the other pill.

After the lead wires are attached the transistors are etched and further fabrication, including encapsulation, is completed in any conventional manner.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

I claim:

1. A method of attaching a lead wire to a silicon semiconductor device having junction-forming region thereon alloyed with aluminum, comprising: placing in contact with the junction-forming aluminum-alloyed region one end of a lead wire composed of a metal selected from the group consisting of platinum and platinum alloys; subjecting the assembly to an ambient temperature in the range of about 630 to 650° C. for a relatively brief period of time sufficient to cause fusion of the outermost regions of the lead wire and alloying thereof with said junction-forming region but without fusion of the core region of said wire; and rapidly cooling said assembly.

2. A method as defined in claim 1 wherein said wire is supported on end atop the junction-forming region to which it is to be attached so that the weight of said wire is effective in establishing pressure contact between said end thereof and said junction-forming region.

References Cited in the file of this patent

UNITED STATES PATENTS

| | | |
|---|---|---|
| 2,763,822 | Frola et al. | Sept. 18, 1956 |
| 2,859,394 | Berman | Nov. 4, 1958 |
| 2,877,396 | Armstrong et al. | Mar. 10, 1959 |
| 2,878,148 | Beale | Mar. 17, 1959 |
| 2,878,432 | Armstrong et al. | Mar. 17, 1959 |